(12) United States Patent
Isoda

(10) Patent No.: US 6,740,903 B2
(45) Date of Patent: May 25, 2004

(54) SUBSTRATE FOR LIGHT EMITTING DIODES

(75) Inventor: Hiroto Isoda, Yamanashi-ken (JP)

(73) Assignee: Citizen Electronics Co., Ltd., Yamanashi-ken (JP)

( * ) Notice: Subject to any disclaimer, the term of this patent is extended or adjusted under 35 U.S.C. 154(b) by 0 days.

(21) Appl. No.: 10/411,134

(22) Filed: Apr. 11, 2003

(65) Prior Publication Data

US 2003/0193083 A1 Oct. 16, 2003

(30) Foreign Application Priority Data

Apr. 15, 2002 (JP) ........................................ 2002-112645

(51) Int. Cl.$^7$ ............................................ H01L 29/267
(52) U.S. Cl. .................... 257/81; 257/678; 257/688; 257/99; 257/80
(58) Field of Search ................................ 257/678, 688, 257/80, 81, 99

(56) References Cited

U.S. PATENT DOCUMENTS

| 5,298,768 A | * | 3/1994 | Okazaki et al. | ................ 257/81 |
| 5,475,241 A | * | 12/1995 | Harrah et al. | .................. 257/99 |
| 6,093,940 A | * | 7/2000 | Ishinaga et al. | ............... 257/99 |
| 2002/0139990 A1 | * | 10/2002 | Suehiro et al. | ................ 257/99 |

* cited by examiner

Primary Examiner—Minhloan Toan
Assistant Examiner—Pershelle Greene
(74) Attorney, Agent, or Firm—Dennison, Schultz, Dougherty & MacDonald

(57) ABSTRACT

A substrate has a pair of metal bases, and a first heat insulation layer disposed between the metal bases. A second heat insulation layer is securely mounted on the metal bases, and a pair of circuit patterns are securely mounted on the second heat insulation layer for mounting an LED.

7 Claims, 8 Drawing Sheets

SUBSTRATE FOR LIGHT EMITTING DIODES

BACKGROUND OF THE INVENTION

The present invention relates to a substrate for a light emitting diode (LED) used in an electronic instrument such as a portable telephone.

In recent years, it is required that the substrate for the LED has a high heat radiation property, heat-resistant property and high mechanical strength in accordance with the tendencies of a high performance, multifunction, small size of the electronic instrument.

FIG. 15 is a perspective view showing a conventional substrate for an LED. The substrate comprises a metal base 51 made of copper or aluminum, an insulation layer 52 of prepreg adhered on the metal base 51, circuit patterns 53 and 54 made of copper foil on which gold is plated. An LED 70 is mounted on the circuit pattern 53 and connected to the circuit pattern 54 by a wire 71.

The metal base 51 has a high heat radiation property.

FIG. 16 is a perspective view of another conventional double face substrate. The substrate comprises a pair of metal bases 61 made of copper, an insulation member 63 between the metal bases 61, insulation layers 62 of prepreg adhered to both sides of the metal bases 61, circuit patterns 64a and 64b made of copper foil on which gold is plated. An LED 72 is mounted on the circuit pattern 64a and connected to the circuit pattern 64b by a wire.

In the substrate of FIG. 15, circuit patterns can not be provided on the underside of the metal base 51. In the substrate of FIG. 16, since the insulation layer 62 is provided on the underside of the metal bases 61, the heat radiation property is insufficient.

SUMMARY OF THE INVENTION

An object of the present invention is to provide a substrate having a high heat radiation property.

According to the present invention, there is provided a substrate comprising a pair of metal bases, a first heat insulation layer disposed between the metal bases, a second heat insulation layer securely mounted on the metal bases, and mounting means for mounting an LED on the substrate.

The mounting means comprises a pair of circuit patterns securely mounted on the second heat insulation layer, the LED is securely mounted on both the circuit patterns.

In another aspect, the mounting means comprises a hole formed in the second heat insulation layer to expose surfaces of metal bases, the LED is securely mounted on both the metal bases.

The substrate further comprises upper and lower electrodes provided on an upper surface of the circuit patterns and on undersides of the metal bases.

One of the metal bases is different from the other metal base in size of a sectional shape.

These and other objects and features of the present invention will become more apparent from the following detailed description with reference to the accompanying drawings.

DETAILED DESCRIPTION OF THE PREFERRED EMBODIMENT

Figure 1:
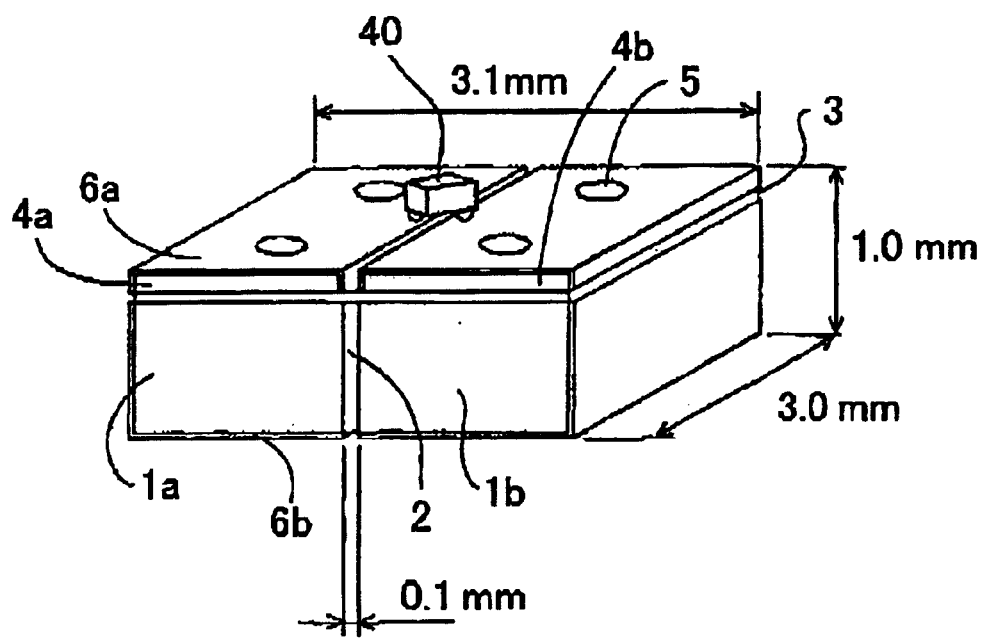
FIG. 1 is a perspective view of a substrate according to a first embodiment of the present invention.

FIG. 1 is a perspective view of a substrate according to a first embodiment of the present invention.

The substrate comprises a pair of metal bases 1a and 1b made of copper, each having a cubic shape, a first heat insulation layer 2 of prepreg between the metal bases 1a and 1b, a second heat insulation layer 3 of prepreg adhered to the metal bases 1a and 1b, a pair of circuit patterns 4a and 4b made of copper foil provided on the second insulation layer 3. On the circuit patterns 4a and 4b, electrodes 6a are formed by gold plating, and terminal electrodes 1b are formed on the underside of metal bases. An LED 40 is securely mounted on both the circuit patterns 4a and 4b.

The LED 40 on the circuit patterns 4a and 4b is connected to the terminal electrodes 6b by through holes 5 passing through the metal bases 1a and 1b.

Dimensions of the substrate, for example, are as shown in FIG. 1.

Since the metal base is made of copper having a high heat conductivity, and there is not provided a heat insulation layer on the underside of the metal base, the substrate is excellent in heat radiation property. Therefore, an LED device using the substrate is properly used in the LED requiring a high current.

Figure 2:
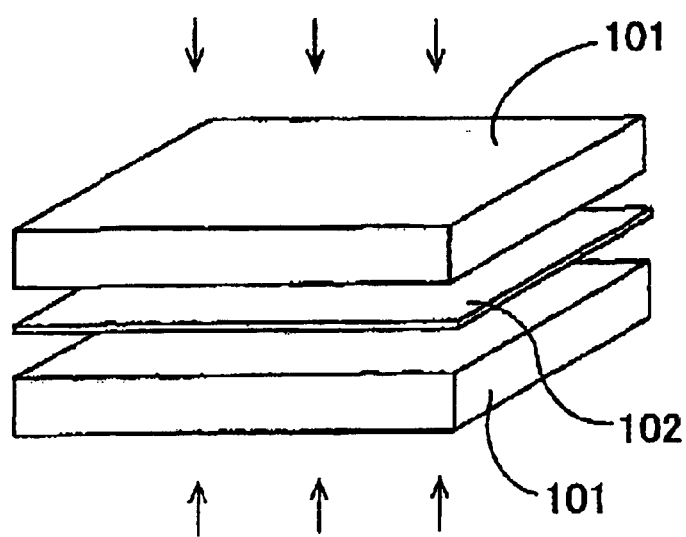
FIGS. 2 and 3 are perspective views showing a preparation of metal bases.
Figure 3:
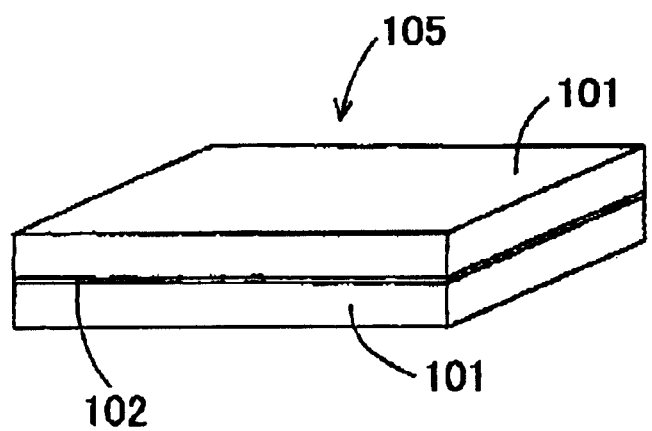

FIGS. 2 and 3 are perspective views showing a preparation of metal bases. A plurality of metal base aggregations 101 and first heat insulation layer aggregations 102 are prepared. As shown in FIG. 3, a pair of metal base aggregations 101 and the insulation layer aggregation are adhered by heat compression, thereby providing a set plate 105.

Figure 4:
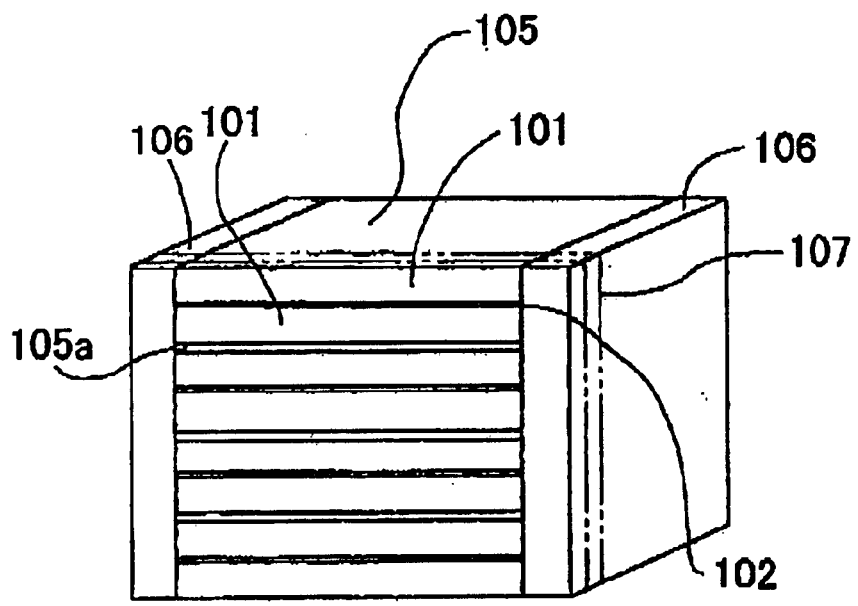
FIGS. 4 through 9 are perspective views showing a method for manufacturing the substrate.
Figure 5:
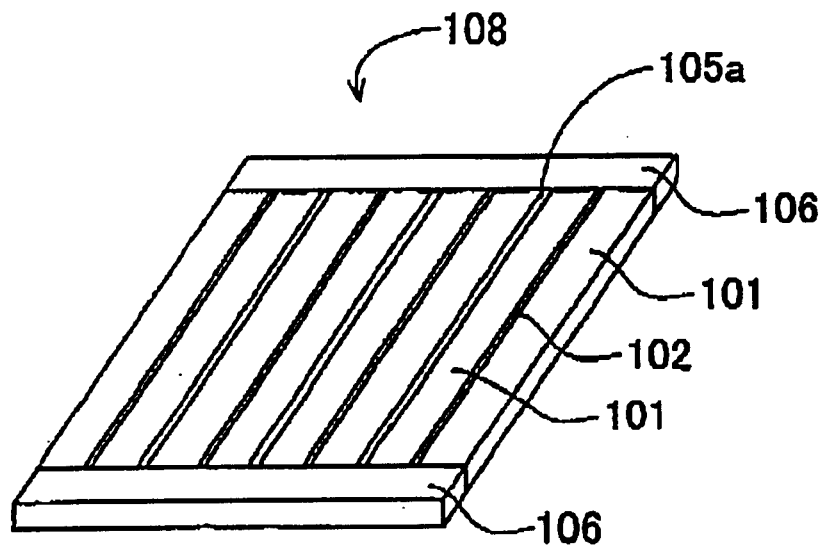

Referring to FIG. 4, a plurality of set plates 105 are arranged between guide plates 106, interposing a gap 105a between adjacent set plates 105. Next, the set plates 105 and guide plates 106 are cut along cutting lines 107, so that a set plate aggregation 108 is provided as shown in FIG. 5.

Figure 6:
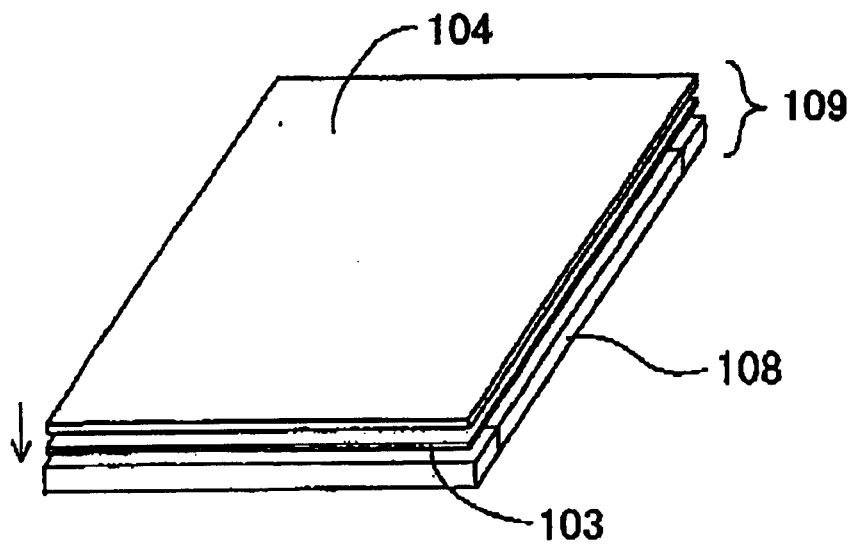

Referring to FIG. 6, a second heat insulation layer aggregation 103 and a circuit pattern layer aggregation 104 are mounted on the set plate aggregation 108 and adhered by heat compression to form an aggregation 109.

Figure 7:
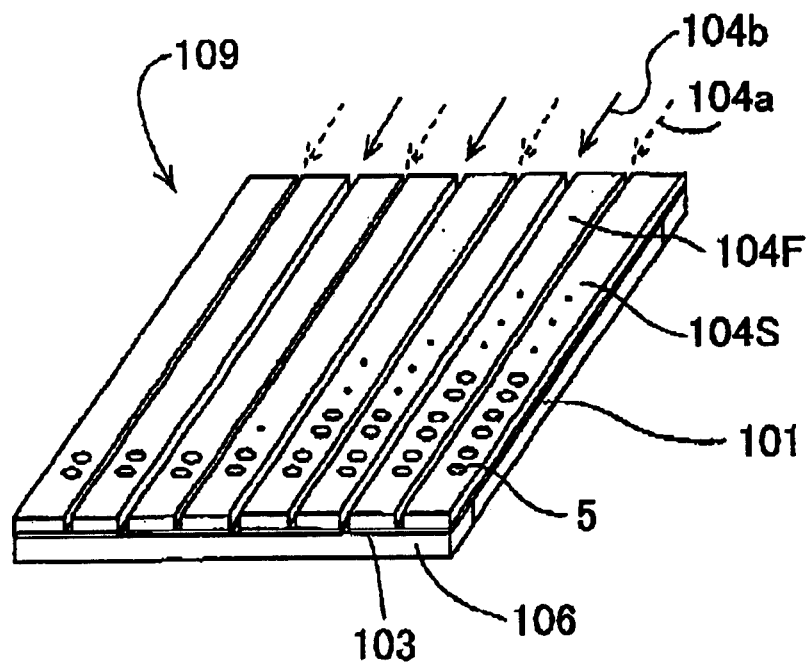

Next, as shown in FIG. 7, the circuit pattern layer aggregation 104 is cut by etching to form a plurality of grooves 104a, thereby separating the aggregation 104 into first and second circuit pattern aggregations 104F and 104S. Further, the aggregation 104 is cut to form grooves 104b corresponding to the gaps 105a. In addition, a plurality of through holes 5 are formed in both aggregations 104F and 104S.

Figure 8:
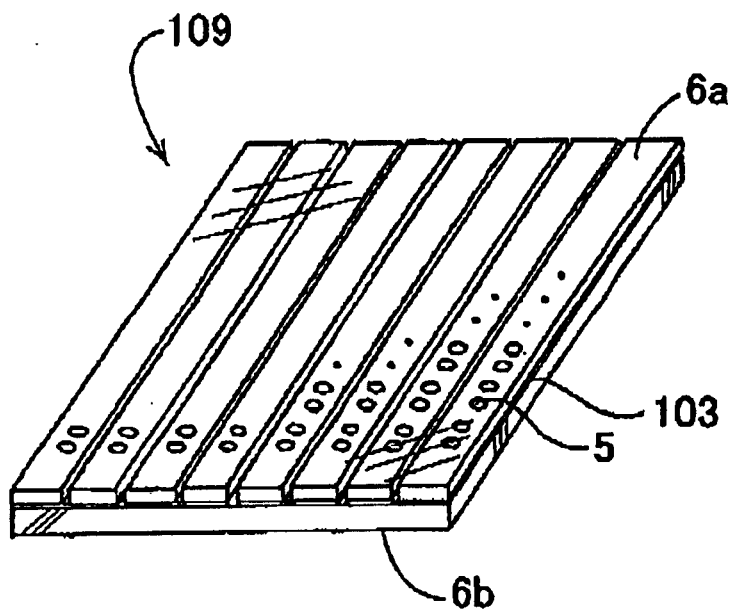

As shown in FIG. 8, the substrate of the aggregation 109 is covered by gold plating to form electrodes 6a and 6b. At that time, the gold enters through holes to connect the upper and lower electrodes 6a and 6b.

Figure 9:
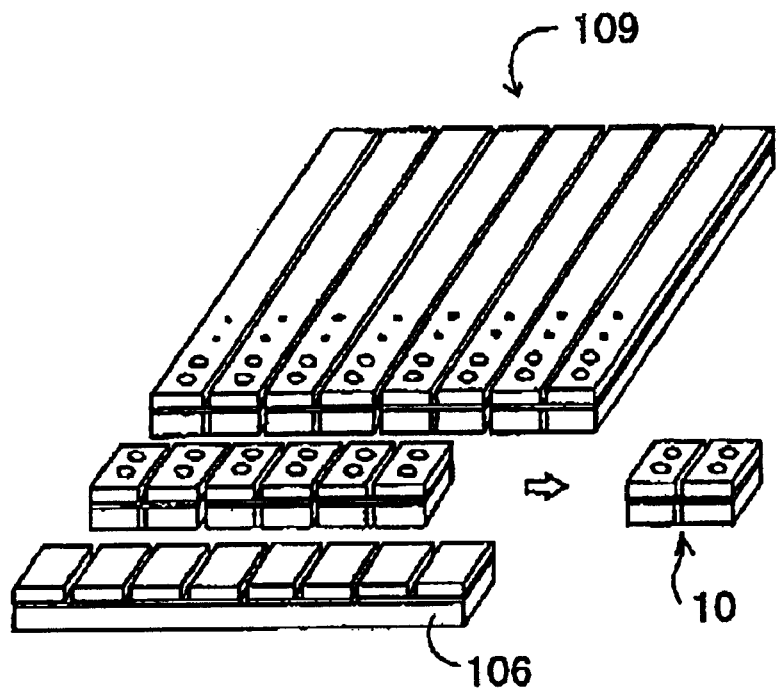

Finally, as shown in FIG. 9, the guide plates 106 are cut off, and the aggregation 109 is separated into unit substrates.

Figure 10:
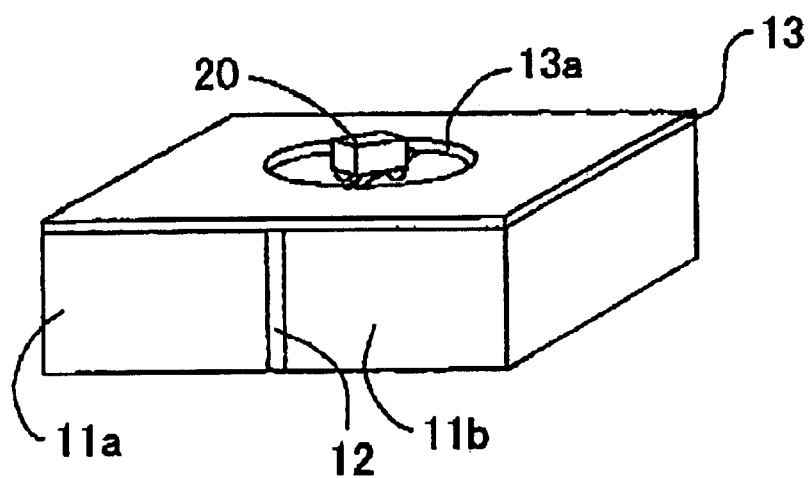
FIG. 10 is a perspective view showing a substrate according to a second embodiment.

FIG. 10 is a perspective view showing a substrate according to a second embodiment.

The substrate comprises a pair of metal bases 11a and 11b made of copper, a first heat insulation layer 12 of prepreg between the metal bases 11a and 11b, a second heat insulation layer 13 of prepreg adhered to the metal bases 11a and 11b. The insulation layer 13 has a central hole 13a. An LED 20 is mounted on both the metal bases 11a and 11b in the central hole 13a.

Since the LED 20 is directly mounted on the metal bases 11a and 11b, the heat radiation property is high.

The manufacturing method is the same as the steps of FIGS. 2 through 5 of the first embodiment.

Figure 11:
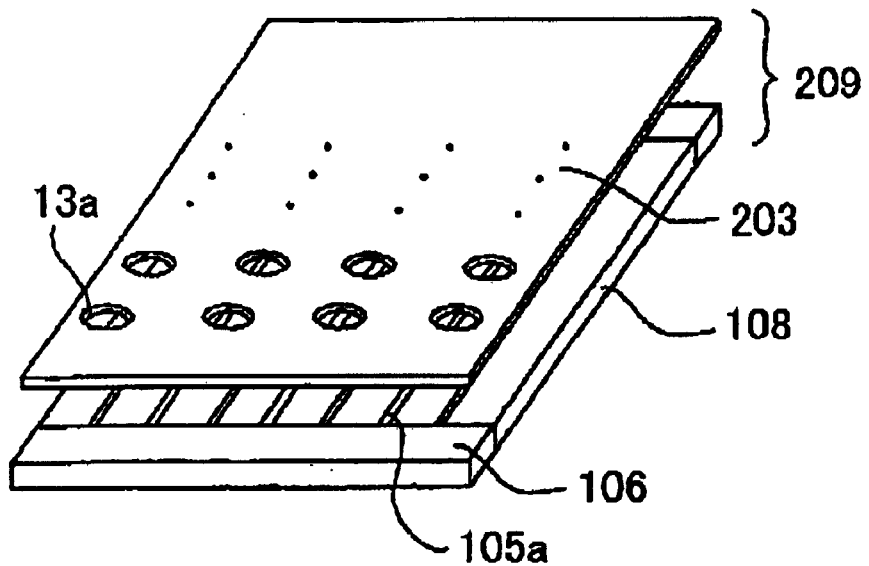
FIGS. 11 through 13 are perspective views showing a manufacturing method of the substrate of the second embodiment.

Referring to FIG. 11, a second heat insulation layer aggregation 203 having a plurality of central holes 13a is mounted on the set plate aggregation 108 and adhered by heat compression to form an aggregation 209.

Figure 12:
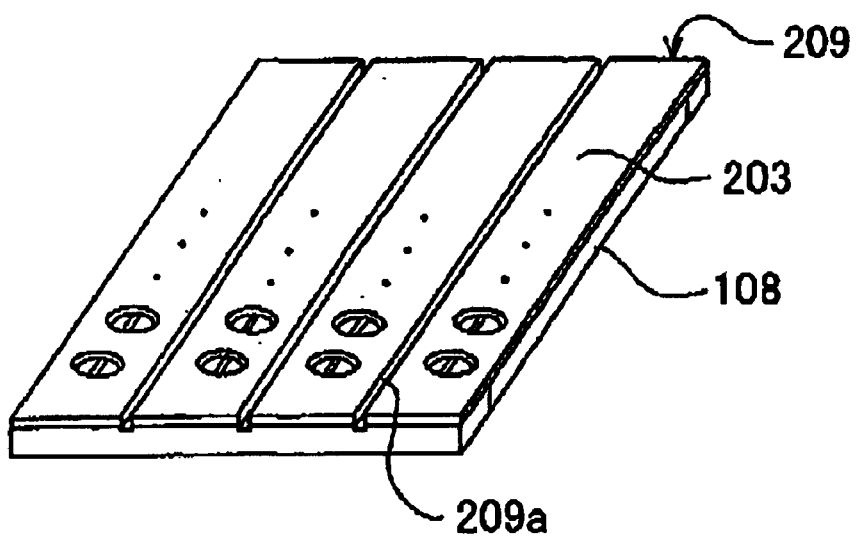

Next, as shown in FIG. 12, the second heat insulation layer aggregation 203 is cut at the gap 105a by cutting to form a plurality of grooves, thereby separating the aggregation 203.

Figure 13:
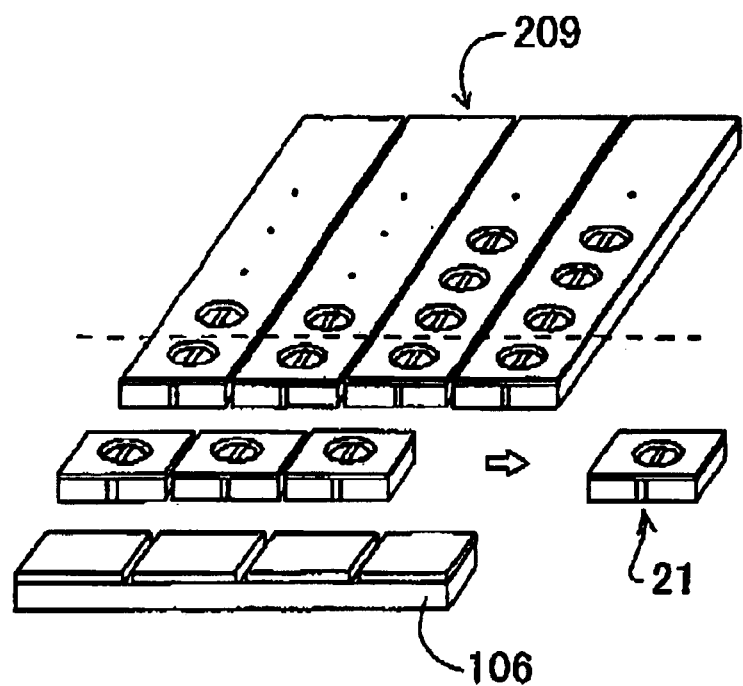

As shown in FIG. 13, the guide plates 106 are cut off, and the aggregation 209 is separated into unit substrates.

Figure 14:
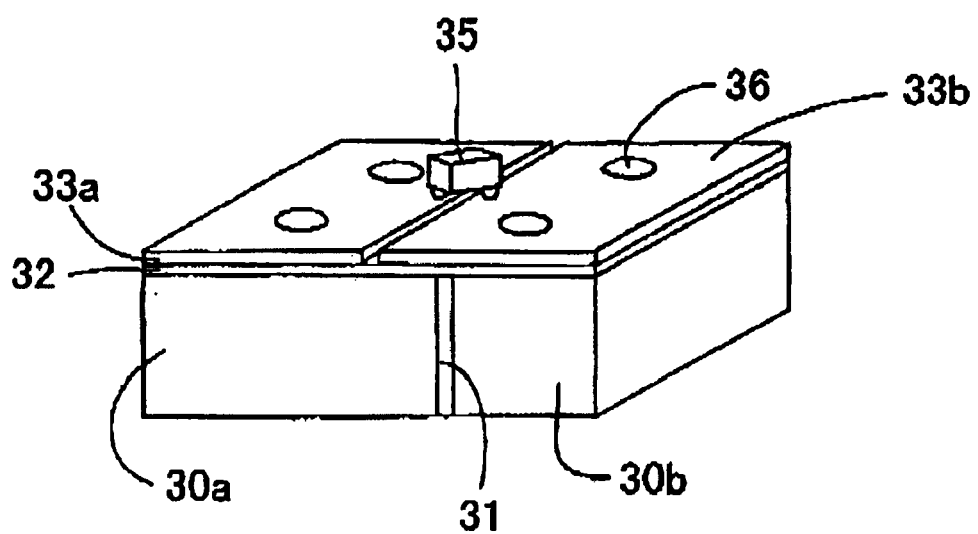
FIG. 14 is a perspective view showing a substrate according to a third embodiment.
Figure 15:
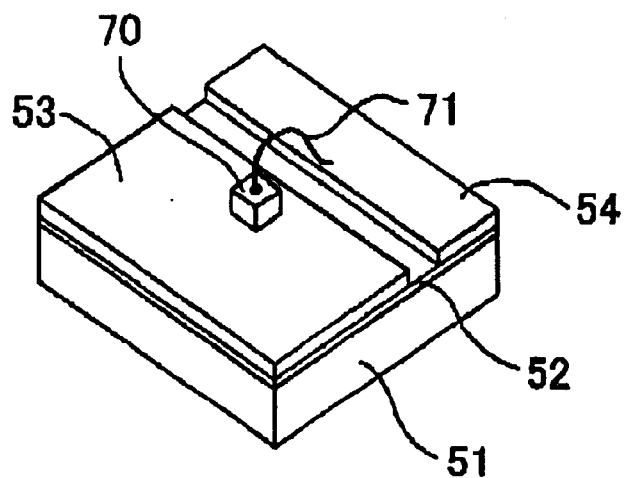
FIG. 15 is a perspective view showing a conventional substrate for an LED.
Figure 16:
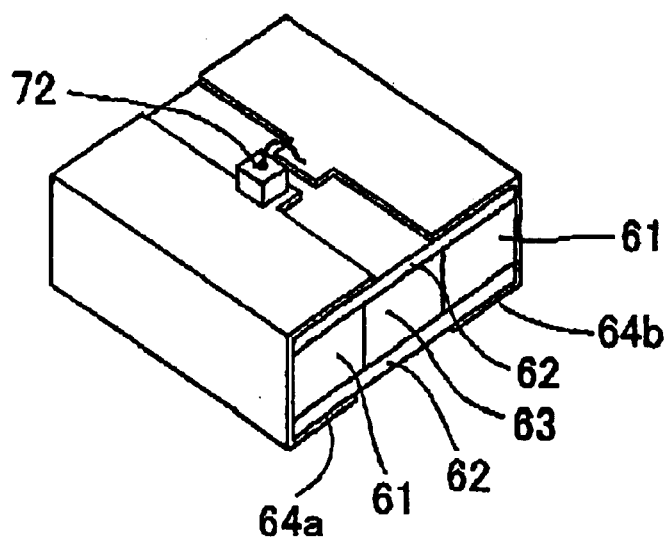
FIG. 16 is a perspective view showing another substrate.

FIG. 14 is a perspective view showing a substrate according to a third embodiment of the present invention.

The substrate comprises a pair of metal bases 30a and 30b made of copper, a first heat insulation layer 31 of prepreg between the metal bases 30a and 30b, a second heat insulation layer 32 of prepreg adhered to the metal bases 30a and 30b, a pair of circuit patterns 33a and 33b made of copper foil provided on the second insulation layer 32. An LED 35 is mounted on both the circuit patterns 33a and 33b.

The LED 35 on the circuit patterns 33a and 33b is connected to the metal bases 30a and 30b by through holes 36.

In the substrate of the third embodiment, the sizes of the metal bases 30a and 30b are different in sectional shape, thereby deflecting the position of the first heat insulation layer from the center line.

The coefficient of the thermal expansion of the first heat insulation layer 31 in the thickness direction is high, so that the positions of the metal bases 30a and 30b are deflected, which may generate stress in the LED 35.

However, since the thermal expansion coefficient of the second heat insulation layer 32 in the plane direction is small, the metal bases are prevented from deflecting, thereby preventing the generation of the stress in the LED.

Furthermore, since the first heat insulation layer 31 is eccentric, the influence of thermal expansion of the first heat insulation layer is reduced.

In accordance with the present invention, a substrate is excellent in heat radiation performance.

While the invention has been described in conjunction with preferred specific embodiment thereof, it will be understood that this description is intended to illustrate and not limit the scope of the invention, which is defined by the following claims.

What is claimed is:

1. A substrate comprising:
   a pair of adjacent metal bases having a first, upper surface and a second, lower surface;
   a first heat insulation layer disposed between the metal bases;
   a second heat insulation layer securely mounted on the metal bases;
   a pair of circuit patterns securely mounted on the second heat insulation layer; and
   an LED mounted on both the circuit patterns, and
   an upper electrode provided on the upper surface of the circuit patterns, and a lower electrode provided on the second, lower surface of the adjacent metal bases.

2. The substrate according to claim 1, wherein each of the circuit patterns is electrically connected with the metal base by a through hole.

3. The substrate according to claim 1, wherein one of the metal bases is different from the other metal base in size of a sectional shape.

4. A substrate comprising:
   a pair of metal bases;
   a first heat insulation layer disposed between the metal bases;
   a second heat insulation layer securely mounted on the metal bases;
   a hole formed in the second heat insulation layer so as to expose upper surfaces of the metal bases; and
   an LED mounted on the exposed surfaces of the metal bases.

5. A substrate comprising:
   a pair of adjacent metal bases having a first, upper surface and a second, lower surface;
   a first heat insulation layer disposed between the adjacent metal bases;
   a second heat insulation layer securely mounted on the first, upper surface the metal bases;
   a pair of circuit patterns securely mounted on the second heat insulation layer; and
   an LED mounted on both the circuit patterns;
   the second, lower surface of the adjacent metal bases being exposed.

6. The substrate according to claim 5, wherein each of the circuit patterns is electrically connected with the metal base by a through hole.

7. The substrate according to claim 5, wherein one of the metal bases is different from the other metal base in size of a sectional shape.

* * * * *